US012621938B2

(12) United States Patent
Su

(10) Patent No.: US 12,621,938 B2
(45) Date of Patent: May 5, 2026

(54) CIRCUIT BOARD STRUCTURE WITH SHIELDING AND HEAT DISSIPATION FUNCTIONS, AND MANUFACTURING METHOD THEREFOR

(71) Applicant: Hsien-Chiang Su, Keelung City (TW)

(72) Inventor: Hsien-Chiang Su, Keelung City (TW)

( * ) Notice: Subject to any disclaimer, the term of this patent is extended or adjusted under 35 U.S.C. 154(b) by 196 days.

(21) Appl. No.: 18/687,567

(22) PCT Filed: Aug. 30, 2021

(86) PCT No.: PCT/CN2021/000175
§ 371 (c)(1),
(2) Date: Feb. 28, 2024

(87) PCT Pub. No.: WO2023/028719
PCT Pub. Date: Mar. 9, 2023

(65) Prior Publication Data
US 2025/0016934 A1 Jan. 9, 2025

(51) Int. Cl.
*H05K 1/181* (2026.01)
*H05K 1/02* (2006.01)
(Continued)

(52) U.S. Cl.
CPC ......... *H05K 3/4053* (2013.01); *H05K 1/0203* (2013.01); *H05K 1/0218* (2013.01);
(Continued)

(58) Field of Classification Search
CPC ......... H05K 1/02; H05K 1/0218–0219; H05K 1/0203; H05K 1/095; H05K 1/097;
(Continued)

(56) References Cited

U.S. PATENT DOCUMENTS 7,129,422 B2 * 10/2006 Arnold .................. H01L 23/552
174/394
7,214,889 B2 * 5/2007 Mazurkiewicz ...... H01L 23/552
428/323
(Continued)

FOREIGN PATENT DOCUMENTS

CN 101287328 A 10/2008
CN 102610590 A 7/2012
(Continued)

*Primary Examiner* — Tuan T Dinh

(74) *Attorney, Agent, or Firm* — MUNCY, GEISSLER, OLDS & LOWE, P.C.

(57) ABSTRACT

The present invention provides a circuit board structure and manufacturing method thereof. Select a processing area for electronic components on a circuit board containing a copper foil layer, and calculate marking points without setting the electronic components. Spray water-based environmentally friendly paint on the circuit board to form a first insulating layer. Cut the circuit board outside the marking points to form through holes, and spray water-based environmentally friendly conductive paint on the first insulating layer to form a conductive layer that forms an electrical connection with the copper foil layer. Finally, spray water-based environmentally friendly paint on the conductive layer to form a second insulating layer, so that electromagnetic waves and other interference of the electronic components are guided to the internal ground plane of the circuit board through the conductive layer for elimination, and heat is dispersed on the first and second insulating layers.

9 Claims, 11 Drawing Sheets

(51) Int. Cl.
    *H05K 1/09*             (2006.01)
    *H05K 3/00*             (2006.01)
    *H05K 3/40*             (2006.01)

(52) U.S. Cl.
    CPC ............. *H05K 1/095* (2013.01); *H05K 1/181*
                        (2013.01); *H05K 3/0044* (2013.01)

(58) Field of Classification Search
    CPC ............. H05K 1/18; H05K 1/181–187; H05K
               3/0044; H05K 3/4053; H05K 9/00; H05K
                            9/0024; H01L 23/552
    USPC ................ 361/760–761, 784, 795, 816, 818;
                         257/787–796; 29/840–855
    See application file for complete search history.

(56)                   References Cited

U.S. PATENT DOCUMENTS

| | | | |
|---|---|---|---|
| 8,716,606 B2 * | 5/2014 | Kelley | H01L 23/573 |
| | | | 174/382 |
| 10,652,996 B2 * | 5/2020 | Chiu | H05K 1/0203 |
| 2010/0195291 A1 | 8/2010 | Kimura et al. | |
| 2012/0069523 A1 * | 3/2012 | Kapusta | H05K 1/181 |
| | | | 361/767 |

FOREIGN PATENT DOCUMENTS

| | | |
|---|---|---|
| CN | 112654130 A | 4/2021 |
| CN | 112825616 A | 5/2021 |
| JP | H04139799 A | 5/1992 |

* cited by examiner

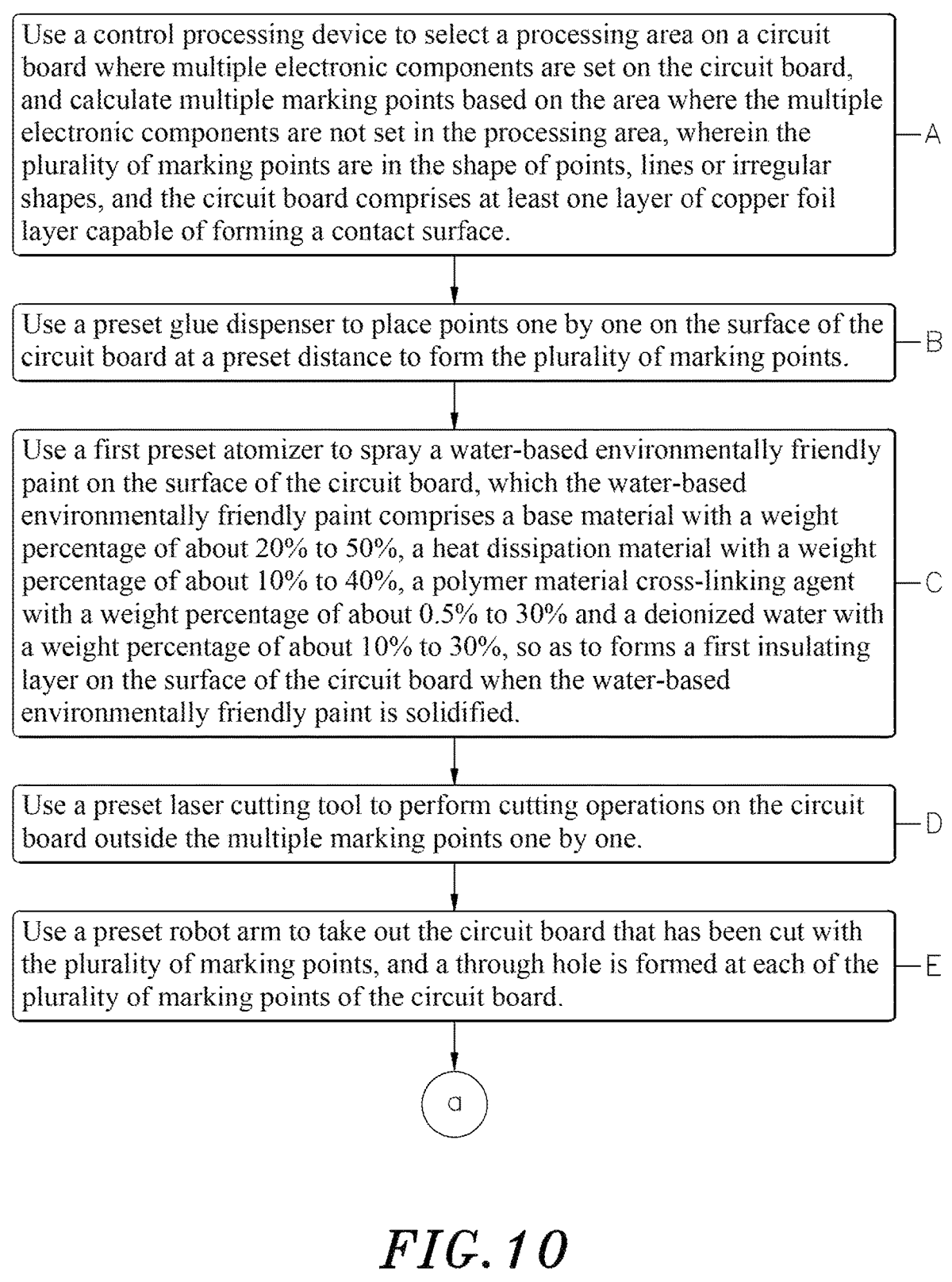

Use a control processing device to select a processing area on a circuit board where multiple electronic components are set on the circuit board, and calculate multiple marking points based on the area where the multiple electronic components are not set in the processing area, wherein the plurality of marking points are in the shape of points, lines or irregular shapes, and the circuit board comprises at least one layer of copper foil layer capable of forming a contact surface. —A Use a preset glue dispenser to place points one by one on the surface of the circuit board at a preset distance to form the plurality of marking points. —B Use a first preset atomizer to spray a water-based environmentally friendly paint on the surface of the circuit board, which the water-based environmentally friendly paint comprises a base material with a weight percentage of about 20% to 50%, a heat dissipation material with a weight percentage of about 10% to 40%, a polymer material cross-linking agent with a weight percentage of about 0.5% to 30% and a deionized water with a weight percentage of about 10% to 30%, so as to forms a first insulating layer on the surface of the circuit board when the water-based environmentally friendly paint is solidified. —C Use a preset laser cutting tool to perform cutting operations on the circuit board outside the multiple marking points one by one. —D Use a preset robot arm to take out the circuit board that has been cut with the plurality of marking points, and a through hole is formed at each of the plurality of marking points of the circuit board. —E ( a )

FIG.10

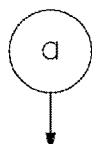

Use a second preset atomizer to spray a water-based environmentally friendly conductive paint on the surface of the circuit board to fill in the plurality of through holes, which the water-based environmentally friendly conductive paint comprises a base material with a weight percentage of 20% to 50%, a binder with a weight percentage of 0.5% to 20%, a polymer material cross-linking agent with a weight percentage of 0.5% to 30% and a deionized water with a weight percentage of 10% to 30%, and forms a conductive layer when solidified, which the conductive layer forms an electrical connection with the copper foil layer inside the circuit board, so that electromagnetic waves, crosstalk, clutter and other interference generated by the operation of the plurality of electronic components can be guided by the conductive layer and the plurality of through holes to the copper foil layer inside the circuit board for elimination. — F Use the first preset atomizer to spray the water-based environmentally friendly paint on the surface of the conductive layer, which the water-based environmentally friendly paint comprises a base material with a weight percentage of about 20% to 50%, a heat dissipation material with a weight percentage of about 10% to 40%, a polymer material cross-linking agent with a weight percentage of about 0.5% to 30% and a deionized water with a weight percentage of about 10% to 30%, and forms a second insulating layer on the surface of the conductive layer when the water-based environmentally friendly paint is solidified. — G

*FIG.11*

CIRCUIT BOARD STRUCTURE WITH SHIELDING AND HEAT DISSIPATION FUNCTIONS, AND MANUFACTURING METHOD THEREFOR

CROSS REFERENCE TO RELATED APPLICATIONS

This application is a U.S. National Stage of International Application No. PCT/CN2021/000175, filed on Aug. 30, 2021, for which priority is claimed under 35 U.S.C. § 120, the entire contents of which are hereby incorporated by reference.

BACKGROUND OF THE INVENTION

1. Field of the Invention

The present invention provides a circuit board structure and manufacturing method that can shield noises and dissipate heat, especially to solve the problems of waterproofness, electromagnetic wave prevention, crosstalk interference and heat dissipation of electronic devices, and it does not require the installation of a metal cover shell to eliminate electromagnetic waves. It can meet the trend of light, thin, short and miniaturized electronic devices, and can effectively reduce the production cost of manufacturing circuit boards.

2. Description of the Related Art

Due to the rapid changes of the times and the rapid advancement of technology, people now pursue a more convenient and faster life. Portable electronic devices (such as smart phones, tablets, laptops and other electronic products) are becoming more common and more important in modern life, and have almost become an indispensable part of daily life. With the rise of the Internet and social networking sites, a single portable electronic device can handle most tasks. Whether it is communications, the Internet, multimedia applications (such as videos or games) or various types of information, they can be easily obtained, used or disseminated in portable electronic devices.

However, currently, various portable electronic devices must use electricity to start and operate, so various portable electronic devices are equipped with batteries to supply power. Power is transmitted to various functional circuit boards through the battery to supply the power required for the operation of the circuit boards, and power can be transmitted between the battery and the circuit boards through electrical connectors. However, the current electrical connectors used to transmit power are assembled using interlocking and clamping methods between the base block and multiple terminals. After being positioned, they can be used directly for power transmission. In practical application and implementation, there are still some shortcomings and inconveniences. For example: after an electrical connector is assembled and positioned, a gap is formed between its base block and multiple terminals. It is easy for external moisture to penetrate into the circuit board through the electrical connector, causing corrosion and oxidation of multiple contacts on the circuit board and pins of various electronic components, which can easily affect the operation of the circuit board, leading to abnormal short circuits or open circuits. Moreover, when electronic devices encounter rainy days or are accidentally spilled with other liquids, the internal parts of the electronic devices can easily be shortcircuited due to moisture, affecting their functionality. Therefore, the waterproofness of circuit boards has gradually attracted the attention of developers.

Moreover, today's electronic devices require a large amount of signal processing, and their signal processing also needs to be faster. Therefore, when an electronic device is in use, its internal electronic components will produce electromagnetic waves, crosstalk interference and high heat energy, which will also interfere with other electronic devices, or cause the internal electronic components to interfere with each other and prevent them from functioning properly. Based on the above, in order to solve the problems of electromagnetic wave, crosstalk interference and heat dissipation, some manufacturers install metal covers on the circuit boards of electronic devices. The metal cover is used to cover the top of the electronic components, and then the metal cover is used to absorb and shield electromagnetic waves and crosstalk interference and provide heat dissipation. However, current electronic devices are developing towards the trend of being light, thin, short, and miniaturized, and installing a metal cover will increase the overall thickness of the electronic device. In addition, the mold opening and assembly of the metal cover will also consume a lot of manufacturing time and cost, which cannot effectively enhance the market competitiveness of electronic devices. Therefore, how to solve the problems of waterproofness, electromagnetic wave prevention, crosstalk interference and heat dissipation of the above-mentioned electronic devices, and at the same time comply with the development trend of electronic devices being light, thin, short and miniaturized, is the direction that relevant manufacturers in this industry are eager to study and improve.

SUMMARY OF THE INVENTION

In view of the aforementioned problems and shortcomings, the inventor has collected relevant information, conducted multiple evaluations and considerations, and drawn upon years of experience in the industry. Through continuous creation and modification, the inventor has designed and created this circuit board structure and manufacturing method that can shield noises and dissipate heat.

The main object of the present invention is to use a control processing device to select a processing area for multiple electronic components on a circuit board, and calculate multiple marking points without setting the multiple electronic components, and the circuit board contains a copper foil layer that can form a contact surface. The multiple marking points are formed on the surface of the circuit board at a preset distance. Spray water-based environmentally friendly paint on the circuit board surface to form a first insulating layer. Carry out circuit board cutting work on the outside of the multiple marking points to form multiple through holes, and spray water-based environmentally friendly paint on the surface of the first insulating layer to form a conductive layer. The conductive layer forms an electrical connection with the copper foil layer inside the circuit board. Finally, water-based environmentally friendly paint is sprayed on the surface of the conductive layer to form a second insulating layer, so that the electromagnetic waves, clutter and other interference of the multiple electronic components are guided to the internal ground plane of the circuit board through the conductive layer for elimination. The heat energy can be guided and dispersed on the surface of the first and second insulating layers for rapid dissipation, which can comply with the trend of electronic devices being light, thin, short, and miniaturized, and can effectively reduce the production cost of circuit board manufacturing.

Another object of the present invention is that the first insulating layer and the second insulating layer are water-based environmentally friendly paints, which comprise a base material with a weight percentage of about 20% to 50%, a heat dissipation material with a weight percentage of about 10% to 40%, a polymer material cross-linking agent with a weight percentage of about 0.5% to 30% and a deionized water with a weight percentage of about 10% to 30%. The base material with a weight percentage of 20% to 50% comprises one or a combination of polyurethane, polyimide, polycarbonate, polyamide, polyethylene tereph-thalate, polyethylene naphthalate, polyethyleneimine, polydimethylsiloxane, acrylic polymer, ether polymer or polyolefin: the heat dissipation material comprises boron nitride, aluminum oxide or aluminum nitride with a weight percentage of 10% to 40% in the form of sheets or fins; the polymer material cross-linking agent with a weight percentage of 0.5% to 30% comprises: hexa(methoxymethyl)mela-mine (hmmm) or aziridine or carbodiimide, and further targets the amino group (—NH2), carboxyl (—COOH), amide bond (—CONH— or —NHCO—) functional group.

Still another object of the present invention is that the conductive layer is also a water-based environmentally friendly paint, which comprises a base material with a weight percentage of 20% to 50%, a binder with a weight percentage of 0.5%~20%, a polymer material cross-linking agent with a weight percentage of 0.5%~30% and a deion-ized water with a weight percentage of 10%~30%, wherein the base material with a weight percentage of 20% to 50% comprises: carbon nanotubes, graphene, silver-coated cop-per and nickel: the binder with a weight percentage of 0.5% to 20% comprises one or a combination of polyurethane, polyimide, polycarbonate, polyamide, polyethylene tereph-thalate, polyethylene naphthalate, polyethyleneimine, polydimethylsiloxane, acrylic polymer, ether polymer or polyolefin: the polymer material cross-linking agent with a weight percentage of 0.5% to 30% comprises hexa(m-ethoxymethyl)melamine (hmmm) or aziridine or carbodiim-ide, and further targets the amino group (—NH2), carboxyl (—COOH), amide bond (—CONH— or —NHCO—) func-tional group.

Still another object of the present invention lies in the circuit board structure, comprising: a circuit board, a first insulating layer, a conductive layer and a second insulating layer. The circuit board has multiple electronic components on the surface, and contains at least one layer of copper foil layer inside that can form a contact surface. The first insulating layer is formed on the circuit board surface and the electronic components, and comprises a base material with a weight percentage of 20%~50%, a heat dissipation material with a weight percentage of 10%~40%, a polymer material cross-linking agent with a weight percentage of 0.5%~30%, and a deionized water with a weight percentage of 10%~30%. The conductive layer is formed on the first insulating layer, and comprises a base material with a weight percentage of 20% to 50%, a binder with a weight percent-age of 0.5% to 20%, a polymer material cross-linking agent with a weight percentage of 0.5% to 30%, and a deionized water with a weight percentage of 10%~30%. The second insulating layer is formed on the conductive layer, and comprises a base material with a weight percentage of 20% to 50%, a boron nitride with a weight percentage of 10% to 40%, a polymer material cross-linking agent with a weight percentage of 0.5% to 30%, and a deionized water with a weight percentage of 10%~30%.

BRIEF DESCRIPTION OF THE DRAWINGS

FIG. 10 is a first part of a flow chart of the circuit board manufacturing method of the present invention.

FIG. 11 is a second part of the flow chart of the circuit board manufacturing method of the present invention.

DETAILED DESCRIPTION OF THE INVENTION

Figure 1:
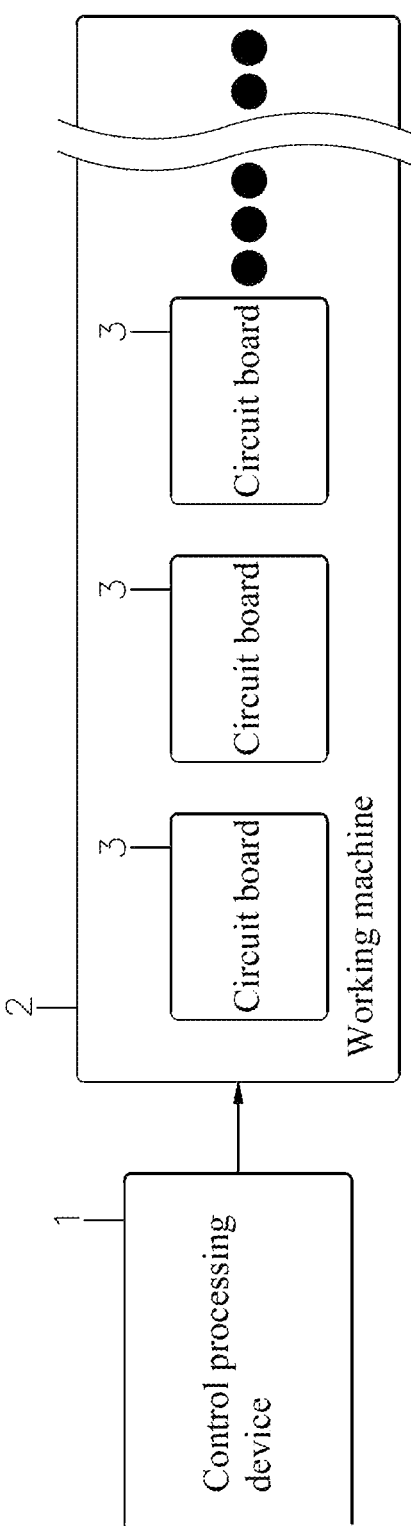
FIG. 1 is a block diagram of the circuit board manufac-turing equipment of the present invention.

In order to achieve the aforementioned objectives and effects, the technical means, structures, and implementation methods used in the present invention are described in detail below with reference to the preferred embodiment shown in the drawings, enabling a complete understanding.

Please refer to FIGS. 1 to 9, which are the block diagram of the circuit board manufacturing equipment of the present invention, and the first, second, third, fourth, fifth, sixth, seventh and eighth operations of circuit board manufactur-ing according to the present invention. It can be clearly seen from the drawings that the circuit board manufacturing equipment for manufacturing circuit boards capable of shielding electromagnetic interference according to the pres-ent invention comprises: a control processing device 1, a working machine 2 and a circuit board 3. Its main compo-nents and features are detailed as follows:

Please refer to FIG. 1, in which the control processing device 1 can manufacture and process multiple circuit boards 3 placed on the working machine 2. The control processing device 1 refers to an industrial computer (IPC) or industrial server. The circuit board 3 refers to a hard fiber-glass circuit board or a flexible circuit board (FPC), and the circuit board 3 comprises at least one layer of copper foil layer 34 that can form a contact surface (as shown in FIG. 4).

Figure 2:
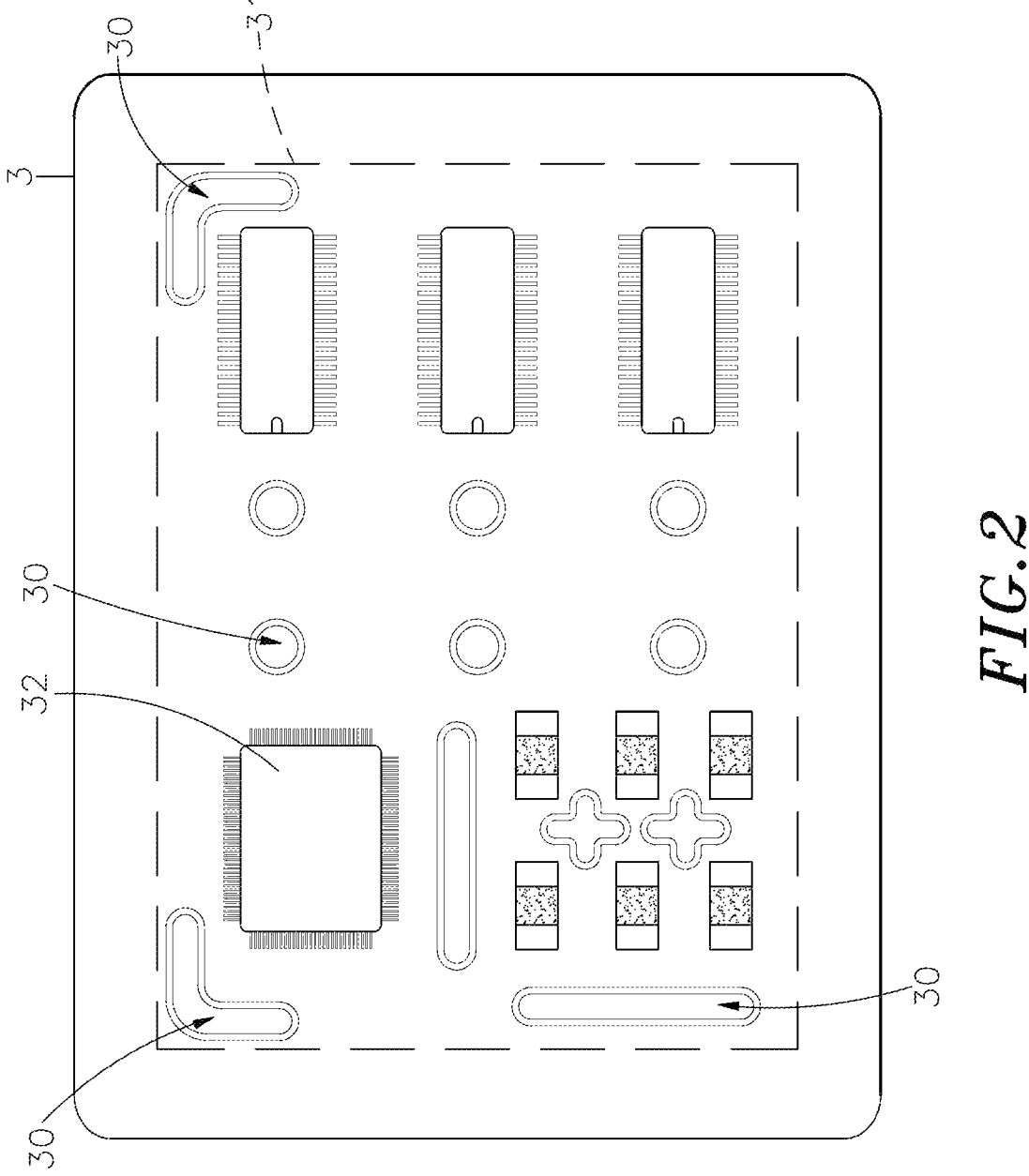
FIG. 2 is a schematic diagram of the first operation of circuit board manufacturing according to the present inven-tion.
Figure 3:
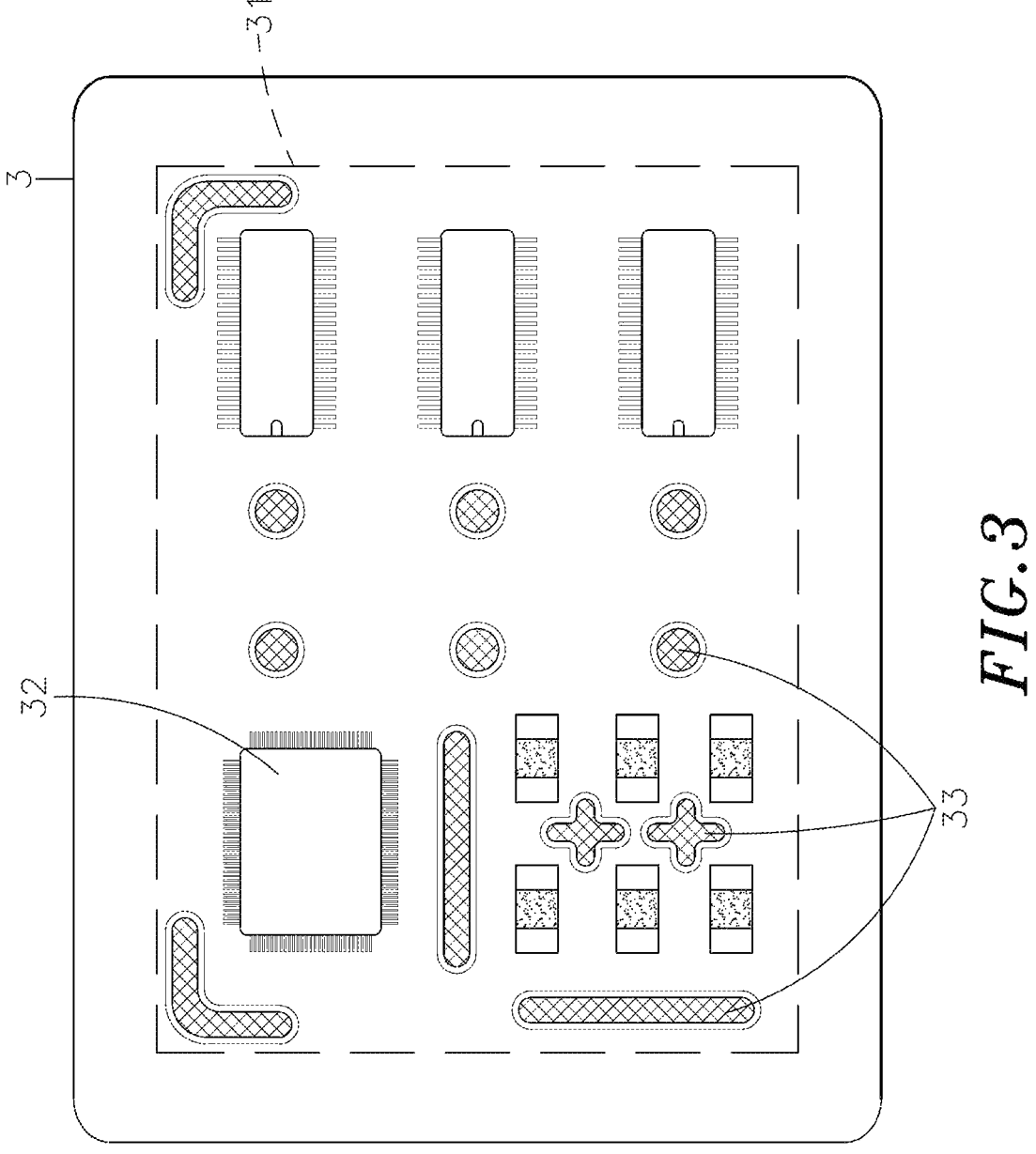
FIG. 3 is a schematic diagram of the second operation of circuit board manufacturing according to the present inven-tion.

Please refer to FIG. 2 and FIG. 3, the control processing device 1 can select a processing area 31 where a plurality of electronic components 32 are set on the circuit board 3, and calculate a plurality of marking points 33 based on the area in the processing area 31 where the plurality of electronic components 32 are not installed. The plurality of marking points 33 are in the shape of points, lines or irregular shapes. The multiple marking points 33 are formed one by one on the surface of the circuit board 3 at a preset distance using a preset glue dispenser (not shown in the drawings). The aforementioned preset distance is 0.5~5 cm (centimeter), and the preset glue dispenser is covered by the general existing technology, so it will not be described again here.

Figure 4:
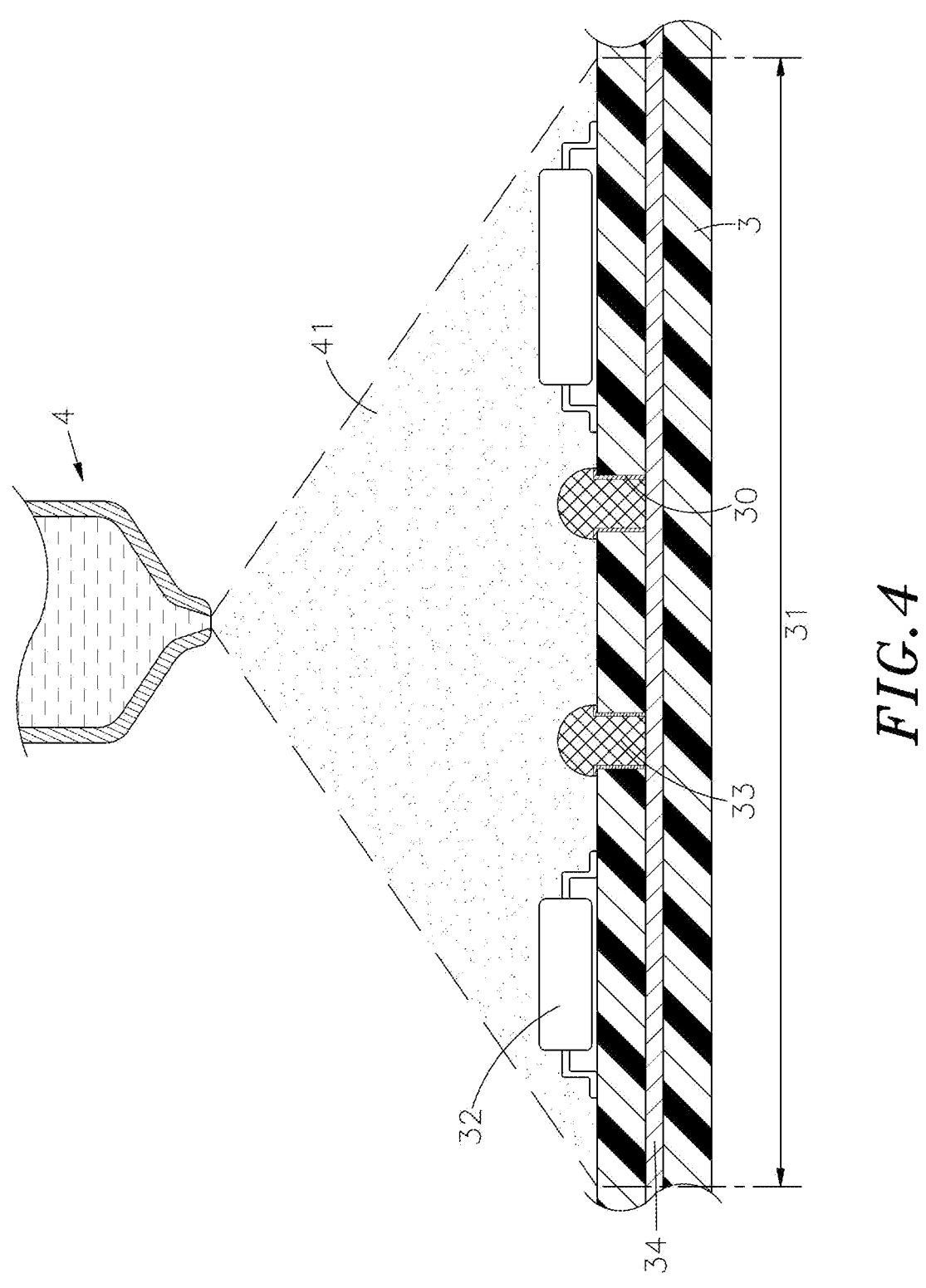
FIG. 4 is a schematic diagram of the third operation of circuit board manufacturing according to the present inven-tion.
Figure 5:
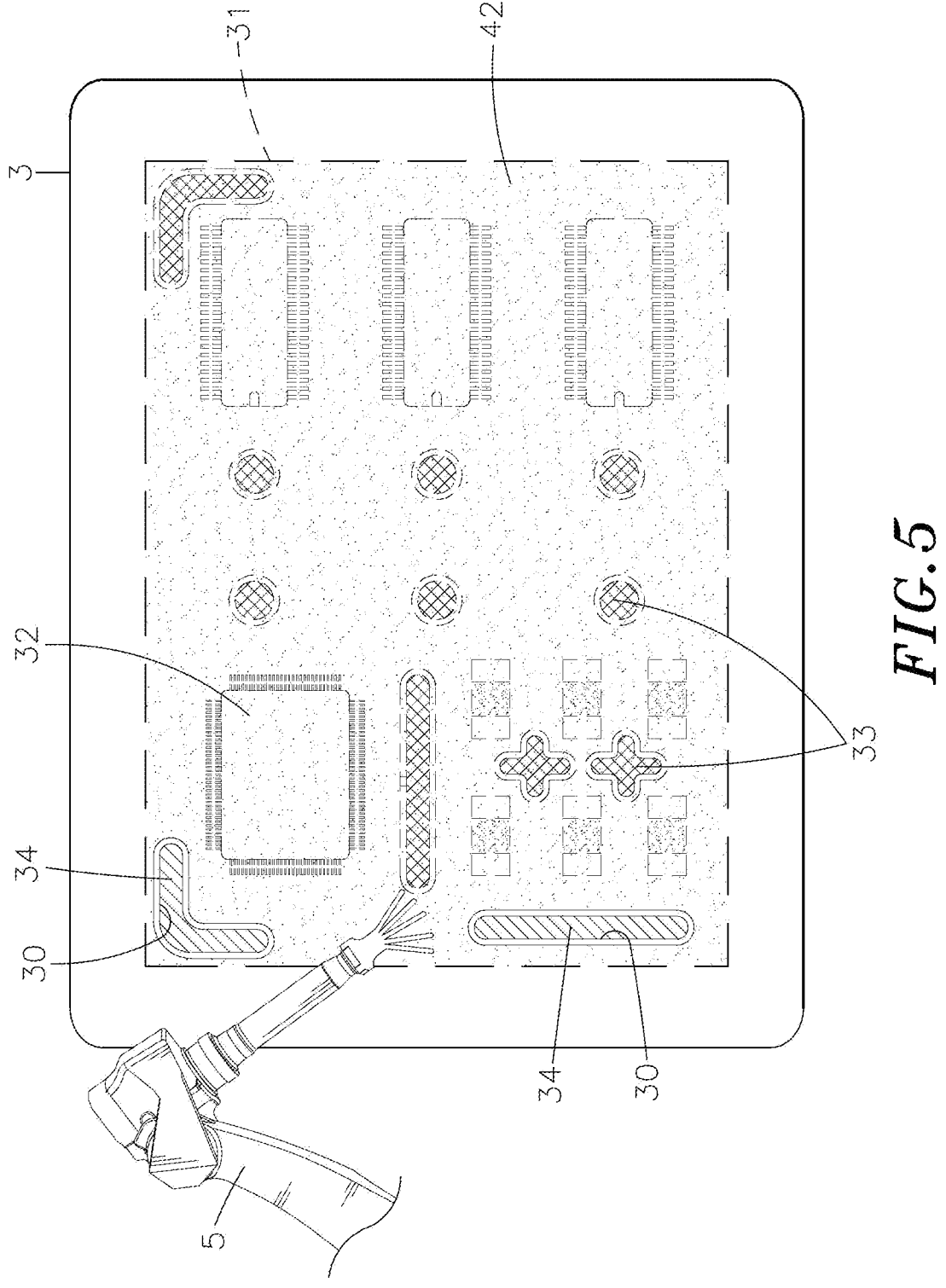
FIG. 5 is a schematic diagram of the fourth operation of circuit board manufacturing according to the present inven-tion.

Please refer to FIG. 4 and FIG. 5, a first preset atomizer 4 is used to spray a water-based environmentally friendly paint 41 on the surface of the circuit board 3, and wait for it to solidify to form a first insulating layer 42. The first insulating layer 42 comprises: a base material with a weight percentage of about 20% to 50%, a heat dissipation material with a weight percentage of about 10% to 40%, a polymer material cross-linking agent with a weight percentage of about 0.5% to 30%, and deionized water with a weight percentage of about 10% to 30%. When the water-based environmentally friendly paint 41 is solidified, the first insulating layer 42 is formed on the surface of circuit board 3. The ingredients of the base material include: one or a combination of polyurethane, polyimide, polycarbonate, polyamide, polyethylene terephthalate, polyethylene naphthalate, polyethyleneimine, polydimethylsiloxane, acrylic polymer, ether polymer or polyolefin. The heat dissipation material comprises: boron nitride, aluminum oxide or aluminum nitride with a weight percentage of 10% to 40% in the form of sheets or fins. The polymer material cross-linking agent with a weight percentage of 0.5% to 30% comprises: hexa(methoxymethyl)melamine (hmmm) or aziridine or carbodiimide, and further targets the amino group (—NH2), carboxyl (—COOH), amide bond (—CONH— or —NHCO—) functional group. In order to clearly show the positions of the multiple marking points 33 and the first insulating layer 42, the multiple electronic components 32 in FIG. 5 are temporarily omitted and are hereby stated.

Please refer to FIG. 5, which uses a preset laser cutting tool (not shown in the drawings) to perform cutting operations on the circuit board 3 outside the multiple marking points 33 one by one. When cutting the circuit board 3, the preset laser cutting tool can choose to completely cut off the circuit board 3 around each marking point 33 or leave a part of the circuit board 3 uncut, which are both within the scope of protection of the present invention. After the above operation is completed, a preset robot arm 5 is used to take out the circuit board 3 that has been cut with the plurality of marking points 33, and a through hole 30 is formed at each of the plurality of marking points 33 of the circuit board 3.

Figure 6:
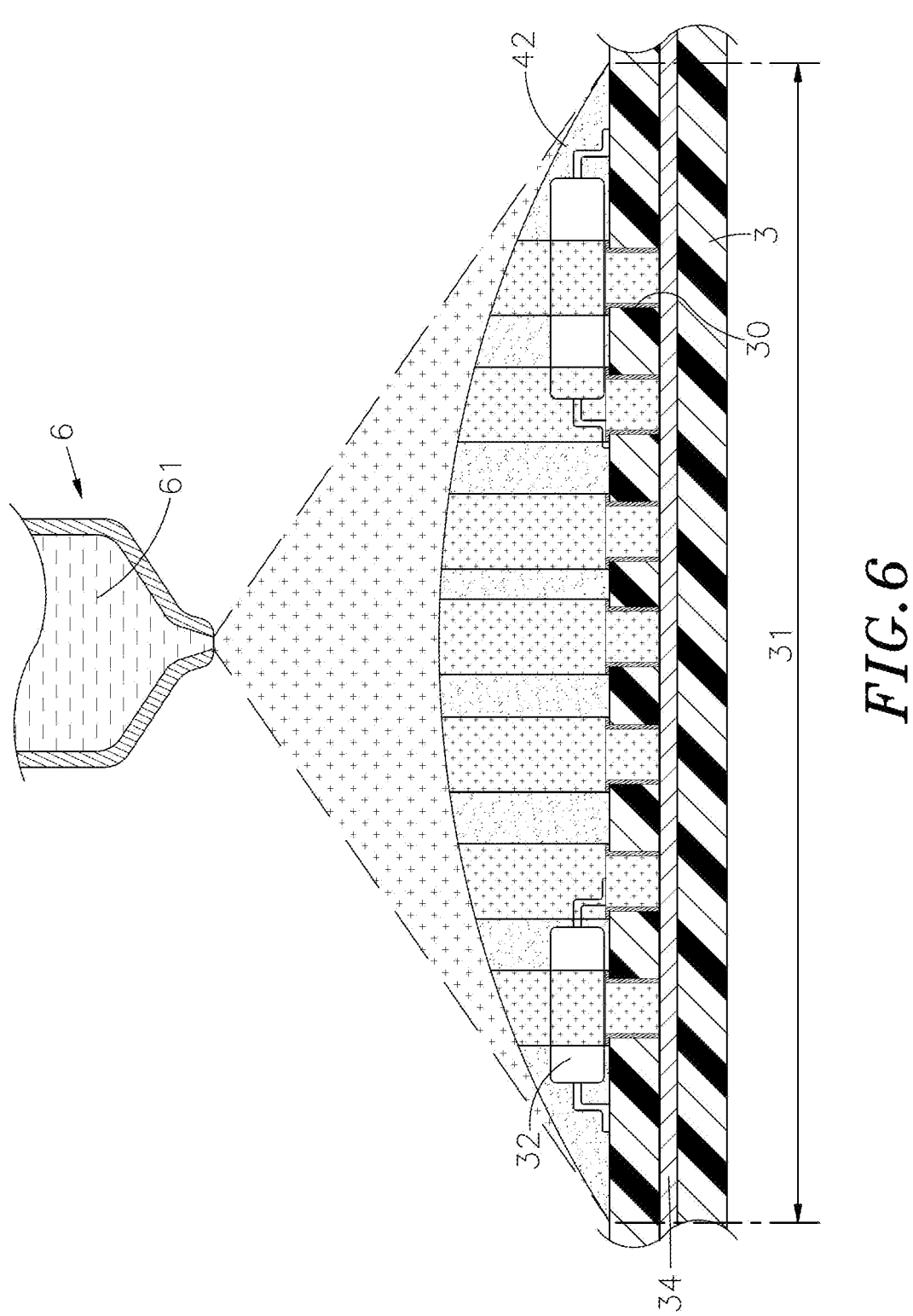
FIG. 6 is a schematic diagram of the fifth operation of circuit board manufacturing according to the present inven-tion.
Figure 7:
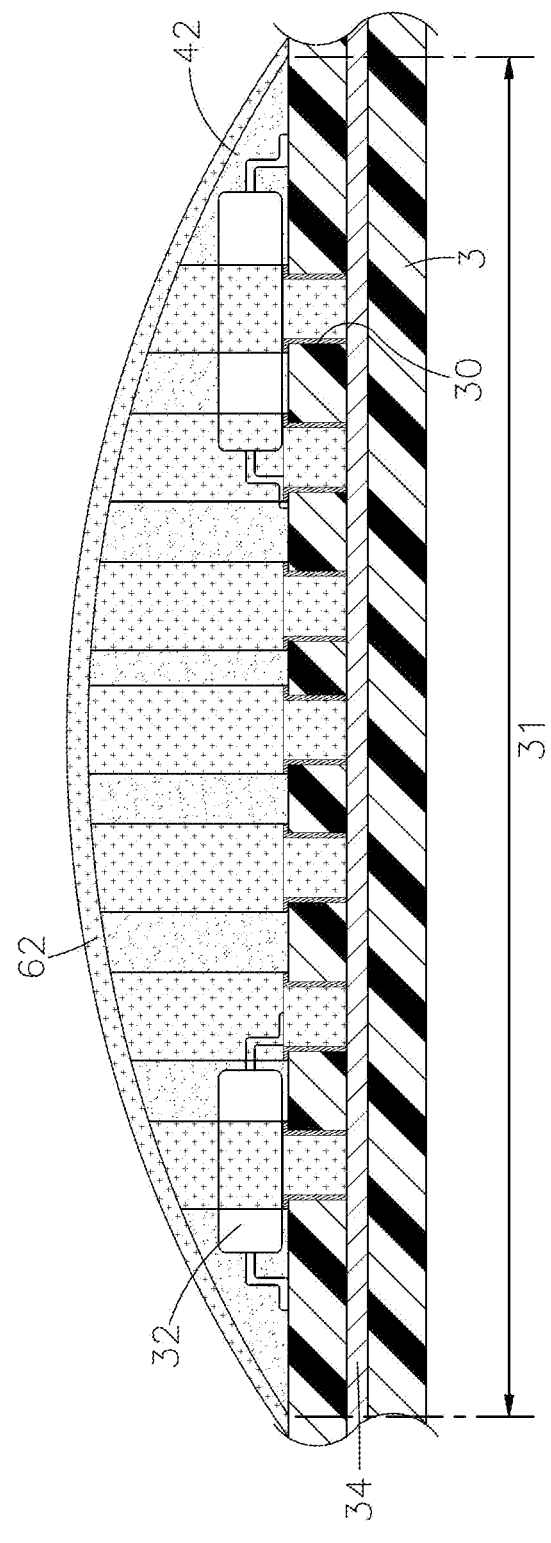
FIG. 7 is a schematic diagram of the sixth operation of circuit board manufacturing according to the present inven-tion.

Please refer to FIG. 6 and FIG. 7, a second preset atomizer 6 is used to spray a water-based environmentally friendly conductive paint 61 on the surface of the circuit board 3, and the water-based environmentally friendly conductive paint 61 is filled in the plurality of through holes 30. When the water-based environmentally friendly conductive paint 61 is solidified, it forms a conductive layer 62. The conductive layer 62 forms an electrical connection with the copper foil layer 34 inside the circuit board 3, so that the electromagnetic waves generated by the operation of the plurality of electronic components 32 are guided by the conductive layer 62 and the plurality of through holes 30 to the copper foil layer 34 inside the circuit board 3 for elimination. The conductive layer 62 can be formed of a water-based environmentally friendly conductive paint that comprises: a base material with a weight percentage of 20% to 50%, a binder with a weight percentage of 0.5% to 20%, and a polymer material cross-linking agent with a weight percentage of 0.5% to 30%, and deionized water with a weight percentage of 10% to 30%. The base material comprises: carbon nanotubes, graphene, silver-coated copper and nickel. The binder includes: one or a combination of polyurethane, polyimide, polycarbonate, polyamide, polyethylene terephthalate, polyethylene naphthalate, polyethyleneimine, polydimethylsiloxane, acrylic polymer, ether polymer or polyolefin. The polymer material cross-linking agent comprises: hexa(methoxymethyl)melamine (hmmm) or aziridine or carbodiimide, and further targets the amino group (—NH2), carboxyl (—COOH), amide bond (—CONH— or —NHCO—) functional group.

The above-mentioned conductive layer 62 is composed of carbon nanotubes, graphene, silver-coated copper and conductive colloid. The silver-coated copper has a flake structure, and its particle length ranges from 10 to 100 μm. When the particle length of the silver-coated copper is within the aforementioned range, the complete shape of the silver-coated copper can be maintained, which is more conducive to reducing the resistance value of the conductive layer 62. The conductive colloid refers to one or a combination of gold glue, silver glue, aluminum glue, copper glue and graphite glue. The conductive layer 62 has a thickness ranging from 1 to 100 μm (microns). A preferred embodiment of the conductive layer 62 has a thickness of 20~60 μm (microns), that is, the resistance value measured at any two points in the conductive layer 62 is less than 10Ω (ohms).

The circuit board that can shield electromagnetic interference produced through the above process is used in the electronic component carrier board test of fifth-generation mobile communications, and is measured under the condition that the thickness of the conductive layer is 20~60 μm (micron). The test data of its ability to shield electromagnetic interference (EMI) are as follows:

| Number of via holes to ground | Measurement distance | Resistance value |
| --- | --- | --- |
| Not grounded | 1 cm | 4Ω |
| Not grounded | 4 cm (first distance) | 5Ω |
| Not grounded | 4 cm (second distance) | 6Ω |
| Not grounded | 4 cm (third distance) | 7Ω |
| 5 points grounded | between two ground points | 3Ω |
| 5 points grounded | 0.5 cm (distance between test point and ground point) | 5Ω |
| 5 points grounded | 4 cm | 7Ω |
| 16 points grounded | between two ground points | 3Ω |
| 16 points grounded | 0.5 cm (distance between the first test point and the ground point) | 4Ω |
| 16 points grounded | 0.5 cm (distance between the second test point and the ground point) | 5Ω |
| 16 points grounded | 0.5 cm (distance between the third test point and the ground point) | 6Ω |
| between two electronic components | 1 cm | 4Ω |
| between two electronic components | 2 cm | 5Ω |
| between two electronic components | 3 cm | 7Ω |
| between two electronic components | 4 cm | 10Ω |

It can be seen from the above table that the measurable resistance value of any two test points on the ground plane formed by the copper foil layer 34 is approximately between 3~4Ω. As the number of grounded via holes (ungrounded, 5 points, 16 points, between two electronic components) and the measurement distance (0.5~4 cm) change, the obtained resistance value (3~10Ω) also changes slightly. However, the conductive layer 62, multiple via holes, and the electromagnetic wave ground path formed by the copper foil layer 34 all maintain extremely low resistance values. In the preferred embodiment, the thickness of the conductive layer 62 is 20~60 μm (microns), so the resistance value measured between any two test points of the ground plane formed by the copper foil layer 34 is about less than 10Ω (ohms). Therefore, the effect of shielding the electromagnetic waves generated by the high-frequency operation of the communication electronic components 32 provided on the circuit board 3 can be achieved as desired by the present invention.

Figure 8:
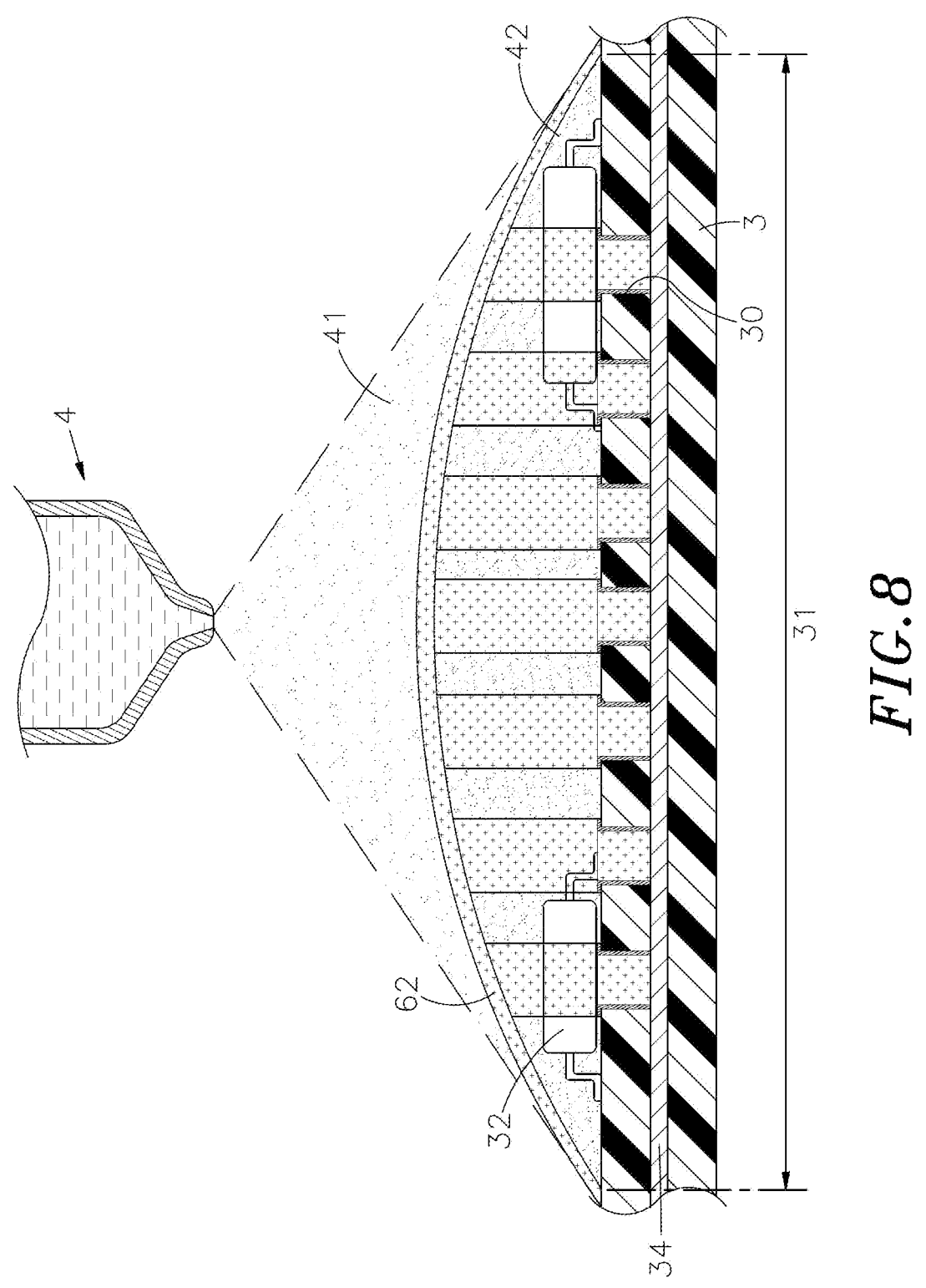
FIG. 8 is a schematic diagram of the seventh operation of circuit board manufacturing according to the present inven-tion.
Figure 9:
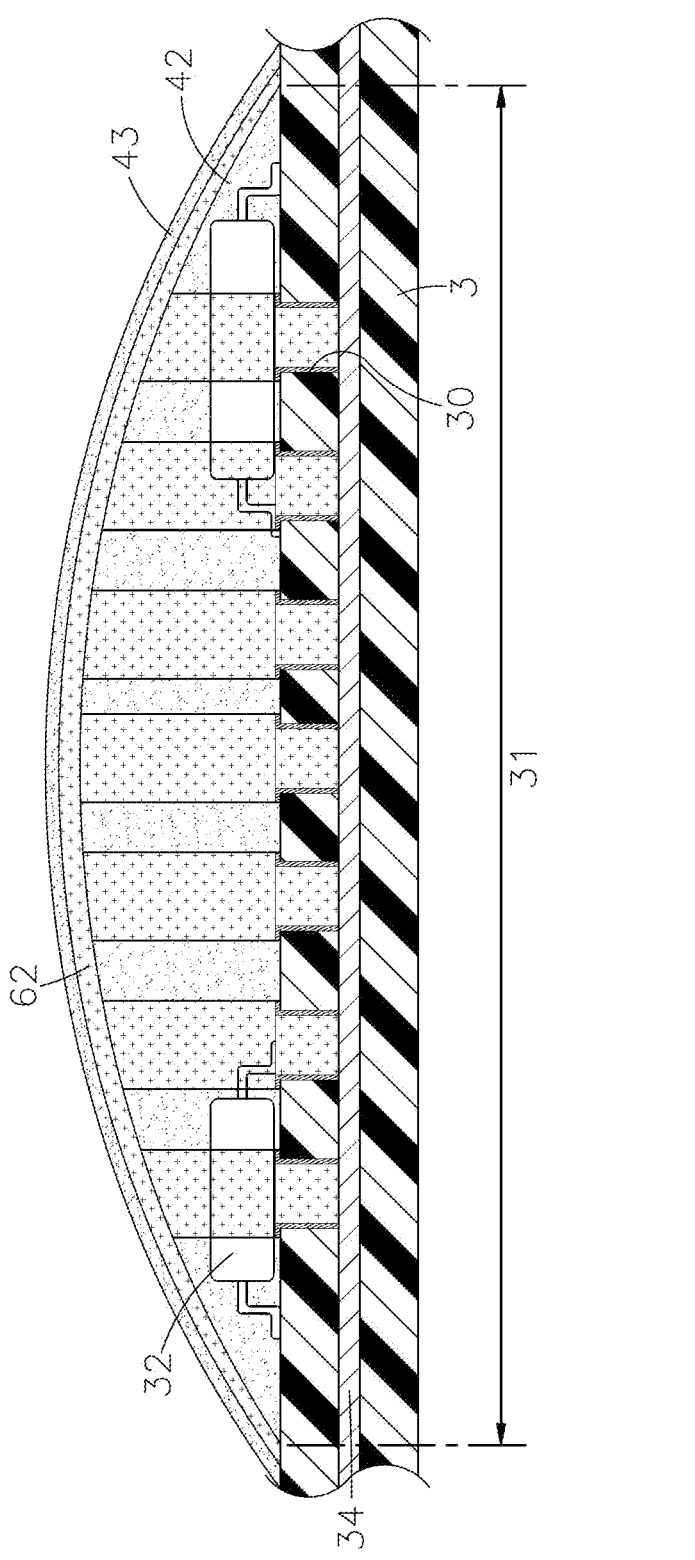
FIG. 9 is a schematic diagram of the eighth operation of circuit board manufacturing according to the present inven-tion.

Please refer to FIG. 8 and FIG. 9, the first preset atomizer 4 is again used to spray the water-based environmentally friendly paint 41 on the surface of the conductive layer 62. When the water-based environmentally friendly paint 41 is solidified, it forms a second insulating layer 43. The second insulating layer 43 comprises: a base material with a weight percentage of about 20% to 50%, a heat dissipation material with a weight percentage of about 10% to 40%, a polymer material cross-linking agent with a weight percentage of about 0.5% to 30%, and deionized water with a weight percentage of about 10% to 30%. Wait for it to solidify to form the first insulating layer 42 on the surface of circuit board 3. The ingredients of the base material include: one or a combination of polyurethane, polyimide, polycarbonate, polyamide, polyethylene terephthalate, polyethylene naphthalate, polyethyleneimine, polydimethylsiloxane, acrylic polymer, ether polymer or polyolefin. The heat dissipation material comprises: boron nitride, aluminum oxide or aluminum nitride with a weight percentage of 10% to 40% in the form of sheets or fins. The polymer material cross-linking agent with a weight percentage of 0.5% to 30% comprises: hexa(methoxymethyl)melamine (hmmm) or aziridine or carbodiimide, and further targets the amino group (—NH2), carboxyl (—COOH), amide bond (—CONH— or —NHCO—) functional group.

The water-based environmentally friendly conductive paint 61 is sprayed on the surface of the above-mentioned circuit board 3 to form a conductive layer 62, and the conductive layer 62 is electrically connected to the copper foil layer 34 inside the circuit board 3, so that interferences such as electromagnetic waves, crosstalk or clutter generated by the operation of the plurality of electronic components 32 are guided by the conductive layer 62 and the plurality of through holes 30 to the copper foil layer 34 inside the circuit board 3 for elimination, so as to solve the problems of waterproofing and anti-electromagnetic waves and crosstalk interference of electronic devices, and it does not require the installation of a metal cover shell to eliminate electromagnetic waves, crosstalk or clutter. It can comply with the trend of electronic devices being light, thin, short and miniaturized, and can effectively reduce the production cost of circuit board manufacturing. As for the surface of the circuit board 3, water-based environmentally friendly paint 41 of different materials is sprayed sequentially, and a first insulating layer 42, a conductive layer 62 and a second insulating layer 43 are formed in sequence. The polymer material cross-linking agent in each layer of material can form links and combinations between polymer materials to provide better bonding between the first insulating layer 42, the conductive layer 62 and the second insulating layer 43, and the bonding effect is better. And the first insulating layer 42 and the second insulating layer 43 include a heat dissipation material. This heat dissipation material, such as boron nitride (BN), aluminum oxide or aluminum nitride, has good thermal conductivity and heat dissipation effects. This invention has excellent practicability in the field of producing wireless communication circuit boards, so a patent application was filed to seek patent protection.

Please refer to FIG. 10 and FIG. 11, which show first and second parts of the flow chart of the manufacturing method of the circuit board structure that can shield noises and dissipate heat according to the present invention, which comprises the following steps:

(A) Use a control processing device 1 to select a processing area on a circuit board 3 where multiple electronic components 32 are set on the circuit board 3, and calculate multiple marking points 33 based on the area where the multiple electronic components 32 are not set in the processing area, wherein the plurality of marking points 33 are in the shape of points, lines or irregular shapes, and the circuit board 3 comprises at least one layer of copper foil layer 34 capable of forming a contact surface.

(B) Use a preset glue dispenser to place points one by one on the surface of the circuit board 3 at a preset distance to form the plurality of marking points 33.

(C) Use a first preset atomizer 4 to spray a water-based environmentally friendly paint 41 on the surface of the circuit board 3, which water-based environmentally friendly paint 41 comprises a base material with a weight percentage of about 20% to 50%, a heat dissipation material with a weight percentage of about 10% to 40%, a polymer material cross-linking agent with a weight percentage of about 0.5% to 30% and a deionized water with a weight percentage of about 10% to 30%, and forms a first insulating layer 42 on the surface of the circuit board 3 when solidified.

(D) Use a preset laser cutting tool to perform cutting operations on the circuit board 3 outside the multiple marking points 33 one by one.

(E) Use a preset robot arm 5 to take out the circuit board 3 that has been cut with the plurality of marking points 33, and a through hole 30 is formed at each of the plurality of marking points 33 of the circuit board 3.

(F) Use the second preset atomizer 6 to spray a water-based environmentally friendly conductive paint 61 on the surface of the circuit board 3 to fill in the plurality of through holes 30, which water-based environmentally friendly conductive paint 61 comprises a base material with a weight percentage of 20% to 50%, a binder with a weight percentage of 0.5%~20%, a polymer material cross-linking agent with a weight percentage of 0.5%~30% and a deionized water with a weight percentage of 10%~30%, and forms a conductive layer 62 when solidified, which conductive layer 62 forms an electrical connection with the copper foil layer 34 inside the circuit board 3, so that electromagnetic waves, crosstalk, clutter and other interference generated by the operation of the plurality of electronic components 32 can be guided by the conductive layer 62 and the plurality of through holes 30 to the copper foil layer 34 inside the circuit board 3 for elimination.

(G) Use the first preset atomizer 4 to spray the water-based environmentally friendly paint 41 on the surface of the conductive layer 62, which water-based environmentally friendly paint 41 comprises a base material with a weight percentage of about 20% to 50%, a heat dissipation material with a weight percentage of about 10% to 40%, a polymer material cross-linking agent with a weight percentage of about 0.5% to 30% and a deionized water with a weight percentage of about 10% to 30%, and forms a second insulating layer 43 on the surface of the conductive layer 62 when solidified.

On the above-mentioned circuit board 3, water-based environmentally friendly paint 41, water-based environmentally friendly conductive paint 61 and water-based environmentally friendly paint 41 of different materials are sprayed on the surface in sequence, and a first insulating layer 42, a conductive layer 62 and a second insulating layer 43 are formed in sequence. The polymer material cross-linking agent in each layer of coating can form links and combinations between polymer materials to provide better bonding between the first insulating layer 42, the conductive layer 62 and the second insulating layer 43, and the bonding effect is better. Moreover, the first insulating layer 42 and the second insulating layer 43 comprise heat dissipation materials. The heat dissipation materials comprise boron nitride (BN), aluminum oxide or aluminum nitride, etc., which have good heat conduction and heat dissipation effects. Interferences such as electromagnetic waves and crosstalk generated by the operation of the plurality of electronic components 32 are guided to the copper foil layer 34 inside the circuit board 3 through the conductive layer 62 and the plurality of through holes 30 for elimination, thereby solving the problems of waterproofing and anti-electromagnetic waves and crosstalk interference of electronic devices. The heat energy generated by the plurality of electronic components 32 during operation can be transmitted to the second insulating layer 43 through the first insulating layer 42 and the conductive layer 62. The heat dissipation materials in the first insulating layer 42 and the second insulating layer 43 uniformly guide the heat energy to the surface and quickly dissipate the heat energy, which can effectively reduce the temperature of the multiple electronic components 32. This achieves the purpose of solving the problems of electronic devices affected by electromagnetic waves, crosstalk interference and heat dissipation. This electronic device does not need to be equipped with a metal shield shell on the outside, and it can also comply with the trend of electronic devices being light, thin, short, and miniaturized, and can further effectively reduce the production cost of circuit board manufacturing.

The above is only a preferred embodiment of the present invention, and does not limit the patent scope of the present invention. Therefore, all simple modifications and equivalent structural changes made by using the contents of the description and drawings of the present invention shall be included in the patent scope of the present invention and shall be clearly stated.

What is claimed is:

1. A manufacturing method of circuit board structure with shielding and heat dissipation functions, comprising steps of:

Step A: using a control processing device to select a processing area on a circuit board where multiple electronic components are set on said circuit board, and calculating multiple marking points based on the area where said multiple electronic components are not set in said processing area, wherein said marking points are selectively in a shape of points, lines or irregular shapes, and said circuit board comprises at least one layer of copper foil layer capable of forming a contact surface;

Step B: using a preset glue dispenser to place points one by one on a surface of said circuit board at a preset distance to form said marking points;

Step C: using a first preset atomizer to spray a water-based environmentally friendly paint on the surface of said circuit board, which said water-based environmentally friendly paint comprising a base material with a weight percentage of about 20% to 50%, a heat dissipation material with a weight percentage of about 10% to 40%, a polymer material cross-linking agent with a weight percentage of about 0.5% to 30% and a deionized water with a weight percentage of about 10% to 30%, so as to form a first insulating layer on the surface of said circuit board when said water-based environmentally friendly paint is solidified;

Step D: using a preset laser cutting tool to perform cutting operations on said circuit board outside said marking points one by one;

Step E: using a preset robot arm to take out said circuit board that has been cut with said marking point, so that a through hole is formed at each said marking point of said circuit board;

Step F: using a second preset atomizer to spray a water-based environmentally friendly conductive paint on the surface of said circuit board, said water-based environmentally friendly conductive paint comprising a base material with a weight percentage of 20% to 50%, a binder with a weight percentage of 0.5%~20%, a polymer material cross-linking agent with a weight percentage of 0.5%~30% and a deionized water with a weight percentage of 10%~30%, enabling said water-based environmentally friendly conductive paint to fill in said through hole, so that said water-based environmentally friendly conductive paint forms a conductive layer when solidified, said conductive layer forming an electrical connection with said copper foil layer inside said circuit board, for allowing electromagnetic waves, crosstalk, clutter and other interference generated by an operation of said electronic components can be guided by said conductive layer and said through holes to said copper foil layer inside said circuit board for elimination; and Step G: using said first preset atomizer to spray said water-based environmentally friendly paint on a surface of said conductive layer, said water-based environmentally friendly paint comprises a base material with a weight percentage of about 20% to 50%, a heat dissipation material with a weight percentage of about 10% to 40%, a polymer material cross-linking agent with a weight percentage of about 0.5% to 30% and a deionized water with a weight percentage of about 10% to 30%, and forms a second insulating layer on the surface of said conductive layer when said water-based environmentally friendly paint is solidified.

2. The manufacturing method of circuit board structure with shielding and heat dissipation functions as claimed in claim 1, wherein said preset distance in Step B is 0.5 cm~5 cm.

3. The manufacturing method of circuit board structure with shielding and heat dissipation functions as claimed in claim 1, wherein in Step C and Step G, said base material with a weight percentage of 20% to 50% comprises one or a combination of polyurethane, polyimide, polycarbonate, polyamide, polyethylene terephthalate, polyethylene naphthalate, polyethyleneimine, polydimethylsiloxane, acrylic polymer, ether polymer or polyolefin, said heat dissipation material comprises boron nitride, aluminum oxide or aluminum nitride with a weight percentage of 10% to 40% in the form of sheets or fins, and said polymer material cross-linking agent with a weight percentage of 0.5% to 30% comprises: hexa(methoxymethyl)melamine (hmmm) or aziridine or carbodiimide, and further targets amino group (—NH2), carboxyl (—COOH), amide bond (—CONH— or —NHCO—) functional group.

4. The manufacturing method of circuit board structure with shielding and heat dissipation functions as claimed in claim 1, wherein a thickness range of said conductive layer described in Step F is 1~100 μm, and preferably 20~60 μm, and a resistance value measured at any two points in said conductive layer is less than 1002.

5. The manufacturing method of circuit board structure with shielding and heat dissipation functions as claimed in claim 1, wherein in Step F, said base material with a weight percentage of 20% to 50% of said water-based environmentally friendly conductive paint comprises: carbon nanotubes, graphene, silver-coated copper and nickel, said binder with a weight percentage of 0.5% to 20% of said water-based environmentally friendly conductive paint comprises one or a combination of polyurethane, polyimide, polycarbonate, polyamide, polyethylene terephthalate, polyethylene naphthalate, polyethyleneimine, polydimethylsiloxane, acrylic polymer, ether polymer or polyolefin, and said polymer material cross-linking agent with a weight percentage of 0.5% to 30% of said water-based environmentally friendly conductive paint comprises hexa(methoxymethyl)melamine (hmmm) or aziridine or carbodiimide, and further targets amino group (—NH2), carboxyl (—COOH), amide bond (—CONH— or —NHCO—) functional group.

6. The manufacturing method of circuit board structure with shielding and heat dissipation functions as claimed in claim 5, wherein said silver-coated copper has a flake structure with a particle length ranging from 10 to 100 μm.

7. A circuit board structure with shielding and heat dissipation functions, comprising a circuit board, a first insulating layer, a conductive layer and a second insulating layer, wherein:

said circuit board is equipped with a plurality of electronic components on a surface thereof, said circuit board comprising at least one layer of copper foil layer to form a contact surface inside;

said first insulating layer is formed on said circuit board surface and said electronic components, said first insulating layer comprising a base material with a weight percentage of 20%~50%, a heat dissipation material with a weight percentage of 10%~40%, a polymer material cross-linking agent with a weight percentage of 0.5%~30%, and a deionized water with a weight percentage of 10%~30%;

said conductive layer is formed on said first insulating layer, said conductive layer comprising a base material with a weight percentage of 20% to 50%, a binder with a weight percentage of 0.5% to 20%, a polymer material cross-linking agent with a weight percentage of 0.5% to 30%, and a deionized water with a weight percentage of 10%~30%;

said second insulating layer is formed on said conductive layer, said second insulating layer comprising a base material with a weight percentage of 20% to 50%, a boron nitride with a weight percentage of 10% to 40%, a polymer material cross-linking agent with a weight percentage of 0.5% to 30%, and a deionized water with a weight percentage of 10%~30%.

8. The circuit board structure with shielding and heat dissipation functions as claimed in claim 7, wherein said base material with a weight percentage of 20% to 50% of said first insulating layer and said second insulating layer comprises one or a combination of polyurethane, polyimide, polycarbonate, polyamide, polyethylene terephthalate, polyethylene naphthalate, polyethyleneimine, polydimethylsiloxane, acrylic polymer, ether polymer or polyolefin; said heat dissipation material of said first insulating layer and said second insulating layer comprises boron nitride, aluminum oxide or aluminum nitride with a weight percentage of 10% to 40% in the form of sheets or fins, and said polymer material cross-linking agent with a weight percentage of 0.5% to 30% of said first insulating layer and said second insulating layer comprises: hexa(methoxymethyl)melamine (hmmm) or aziridine or carbodiimide, and further targets amino group (—NH2), carboxyl (—COOH), amide bond (—CONH— or —NHCO—) functional group.

9. The circuit board structure with shielding and heat dissipation functions as claimed in claim 7, wherein said base material with a weight percentage of 20% to 50% of said conductive layer comprises: carbon nanotubes, graphene, silver-coated copper and nickel, said binder with a weight percentage of 0.5% to 20% of said conductive layer comprises one or a combination of polyurethane, polyimide, polycarbonate, polyamide, polyethylene terephthalate, polyethylene naphthalate, polyethyleneimine, polydimethylsiloxane, acrylic polymer, ether polymer or polyolefin, and said polymer material cross-linking agent with a weight percentage of 0.5% to 30% of said conductive layer comprises hexa(methoxymethyl)melamine (hmmm) or aziridine or carbodiimide, and further targets amino group (—NH2), carboxyl (—COOH), amide bond (—CONH— or —NHCO—) functional group.

* * * * *